I

(12) United States Patent
Pradhan et al.

(10) Patent No.: US 11,881,774 B2
(45) Date of Patent: Jan. 23, 2024

(54) SWITCHING CONVERTER CONTROL LOOP AND DYNAMIC REFERENCE VOLTAGE ADJUSTMENT

(71) Applicant: TEXAS INSTRUMENTS INCORPORATED, Dallas, TX (US)

(72) Inventors: Bikash Kumar Pradhan, Bengaluru (IN); Preetam Charan Anand Tadeparthy, Bengaluru (IN); Muthusubramanian Venkateswaran, Bengaluru (IN); Venkatesh Wadeyar, Bengaluru (IN); Siddaram Mathapathi, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 298 days.

(21) Appl. No.: 17/200,564

(22) Filed: Mar. 12, 2021

(65) Prior Publication Data
US 2022/0294344 A1  Sep. 15, 2022

(51) Int. Cl.
*H02M 3/158* (2006.01)
*H02M 1/00* (2006.01)

(52) U.S. Cl.
CPC ............ *H02M 3/158* (2013.01); *H02M 1/00* (2013.01); *H02M 1/0045* (2021.05)

(58) Field of Classification Search
CPC ....... H02M 3/158; H02M 1/00; H02M 1/0045
See application file for complete search history.

(56) References Cited

U.S. PATENT DOCUMENTS

| 10,778,101 | B1* | 9/2020 | Schmitz | H02M 3/1584 |
|---|---|---|---|---|
| 2005/0010826 | A1* | 1/2005 | Pullen | H02M 3/156 |
| | | | | 713/300 |
| 2014/0032942 | A1 | 1/2014 | Takehara et al. | |
| 2014/0266119 | A1 | 9/2014 | Burton et al. | |
| 2015/0263603 | A1* | 9/2015 | Pahlevaninezhad | H02M 1/4208 |
| | | | | 363/17 |
| 2017/0019026 | A1 | 1/2017 | Nien et al. | |
| 2020/0287459 | A1* | 9/2020 | Schmitz | H02M 3/157 |

OTHER PUBLICATIONS

Enhanced 6-Phase PWM Controller with 8-Bit VID Code and Differential Inductor DCR or Resistor Current Sensing, Intersil Datasheets, vol. ISL6327, May 5, 2008, XP002493820 (pp. 1-29).
International Search Report in corresponding PCT Application No. PCT/US2022/020221, dated Jun. 14, 2022 (5 pages).

\* cited by examiner

*Primary Examiner* — Rafael O De Leon Domenech
(74) *Attorney, Agent, or Firm* — Ray A. King; Frank D. Cimino

(57) ABSTRACT

A controller includes: a pulse-width modulation (PWM) circuit; a control loop; and a reference voltage controller. The control loop has: a feedback input adapted to be coupled to an output voltage of a power stage; a control loop output coupled to a PWM control input; and an operational amplifier with a first feedback input, a first reference input, and an amplifier output, the first feedback input connected to the feedback input, and the amplifier output coupled to the PWM control input. The reference voltage controller has a reference voltage output coupled to the first reference input, the reference voltage controller configured to adjust a reference voltage provided to the reference voltage output responsive to a dynamic error estimate based on error in the operational amplifier.

9 Claims, 6 Drawing Sheets

TEMP SENSING USING METAL RESISTOR:

TAKING AT TEMP = T, RESISTOR DIVIDER VOLTAGE AS $V_T$, ADC CODE FOR $V_T$ WOULD BE $$VT = (1+\alpha) * V_{bg} * \frac{[R_M(1+bT)]}{(R_M(1+bT) + R_1(1+cT))} * 2^N/(1+\alpha) * V_{ADC}$$

$\alpha$ – Bandgap drift co-efficient
$b$ – metal resistor temp co-efficient (~4000 PPM/C)
$c$ – P1HSR resistor temp co-efficient (~-30 PPM/C)

$$= V_{bg} * \frac{[R_M(1+bT)]}{(R_M(1+bT) + R_1(1+cT))} * 2^N/V_{ADC}$$

$$= V_{bg} * \frac{[R_M(1+bT)]}{(R_M+R_1) + R_M*bT + R_1*cT} * 2^N/V_{ADC}$$

$$= V_{bg} * \frac{[R_M/(R_M+R_1)(1+bT)]}{1 + R_M/(R_M+R_1)*bT + R_1/(R_M+R_1)*cT} * 2^N/V_{ADC}$$

$$= V_{bg} * R_M/(R_M+R_1) * (1+bT) * (1-R_1*bT/R_M+R_1) * 2^N/V_{ADC}$$

$$= V_{bg} * R_M/(R_M+R_1) * (1+R_1*bT/(R_M+R_1)) * 2^N/V_{ADC}$$

$$T = \frac{[\frac{VT}{V_{bg}*(R_M+R_1)} - 1]}{R_1/(R_1+R_M)*b} * 2^N/V_{ADC}$$

$V_{bg} * R_M/(R_M+R_1)$, $R_1/(R_1+R_M)$ - CALIBRATED AT ROOM TEMP $b$ - CAN HAVE 4.2% ERROR ACCORDING LBC9 PCD. SO TEMP ACCURACY CAN BE OF 4.2%

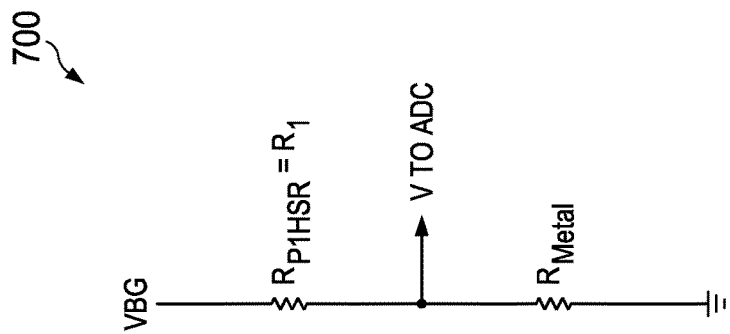

FIG. 7

SWITCHING CONVERTER CONTROL LOOP AND DYNAMIC REFERENCE VOLTAGE ADJUSTMENT

BACKGROUND

As new electronic devices are developed and integrated circuit (IC) technology advances, new IC products are commercialized. One example IC product for electronic devices is a switching converter controller. In general, switching converters convert an input voltage to an output voltage. Depending on the type of switching converter, the output voltage may be greater than (boost converter), less than (buck converter) or a combination of less than/greater than (buck-boost converter) the input voltage. The controller for a switching converter is responsible, in part, for controlling the switches (typically part of a "power stage") so as to maintain regulation of the output voltage.

In a multiphase switching converter controller, a related control loop includes multiple amplifiers, where each amplifier offset contributes to the overall accuracy of the regulated output voltage (VOUT). Conventionally, there are two ways VOUT is trimmed at final test to eliminate VOUT inaccuracy. The first trimming technique involves trimming each amplifier separately at final test to take care of the offsets and achieve a desired accuracy target for VOUT. This first trimming technique imposes two problems: die area (each amplifier needs its own trim circuitry); and test time (trimming individual amplifiers adds extra test time at final test). The second trimming technique involves adjusting a reference voltage to achieve a target VOUT. However, this second trimming technique does not support multiple VOUT options because trimming for one VOUT target results in inaccuracy if another VOUT target is desired.

SUMMARY

In at least one example, a controller comprises a pulse-width modulation (PWM) circuit having a PWM control input and a PWM circuit output; and a control loop. The control loop has: a feedback input adapted to be coupled to an output voltage of a power stage; a control loop output coupled to the PWM control input; and an operational amplifier with a first feedback input, a first reference input, and an amplifier output, the first feedback input connected to the feedback input, and the amplifier output coupled to the PWM control input. The controller also comprises a reference voltage controller having a reference voltage output coupled to the first reference input, the reference voltage controller configured to adjust a reference voltage provided to the reference voltage output responsive to a dynamic error estimate based on error in the operational amplifier.

In another example, a switching converter includes a power stage and a switching converter controller adapted to be coupled to the power stage. The switching converter controller includes: a PWM circuit; a control loop coupled to the PWM circuit; and a reference voltage controller coupled to the control loop. The reference voltage controller is configured to: determine a dynamic output voltage error of the power stage due to the control loop; and adjust a control loop reference voltage provided to the control loop responsive to the determined dynamic output voltage error The control loop is configured to provide a control signal to the PWM circuit responsive to the adjusted control loop reference voltage.

In another example, a switching converter operable to provide an output voltage comprises: a power stage having a power stage input and a power stage output adapted to provide the output voltage; and a switching converter controller coupled to the power stage input. The switching converter controller having: a control loop having: a first feedback input coupled to the power stage output; a control loop output coupled to the power stage input; an operational amplifier with a second feedback input, a first reference input, and an amplifier output, the second feedback input coupled to the first feedback input, and the amplifier output connected to the control loop output; and a reference voltage controller. The reference voltage controller includes: a digital-to-analog converter (DAC) having a DAC reference input and a DAC output; and a reference voltage output connected to the first reference input. The reference voltage controller is configured to provide a control signal to the DAC reference input to adjust a reference voltage at the DAC output responsive to a dynamic error estimate based on output error of the operational amplifier.

BRIEF DESCRIPTION OF THE DRAWINGS

FIG. 7 is diagram of temperature sensing using a metal resistor to perform dynamic error estimation and correction for a reference voltage controller in accordance with another example embodiment.

The same reference numbers are used in the drawings to designate the same (or similar) features.

DETAILED DESCRIPTION

As described herein, a switching converter controller includes a control loop that unintentionally introduces error into a power stage output voltage (VOUT). Examples of control loop error sources include amplifiers (e.g., operational amplifier), error estimation components or models, temperature drift, aging drift, or other sources. To account for control loop error sources, switching converter controller includes a reference voltage controller to adjust the reference voltage to the control loop, where the reference voltage controller includes error estimation and correction components. In one example embodiment, control loop error estimation components of the reference voltage controller use error models, measurements, and/or custom use parameters to determine a dynamic error estimate for the control loop. Once the dynamic error estimate is determined, the control loop error correction components of the reference voltage controller apply a correction to the control loop reference voltage to account for the dynamic error estimate. In one example embodiments, the reference voltage controller of the control loop includes a digital-to-analog converter (DAC). In this example, adjusting the DAC reference voltage responsive to the dynamic error estimate, results in a control loop reference voltage that reduces VOUT error introduced by the control loop.

Figure 1:
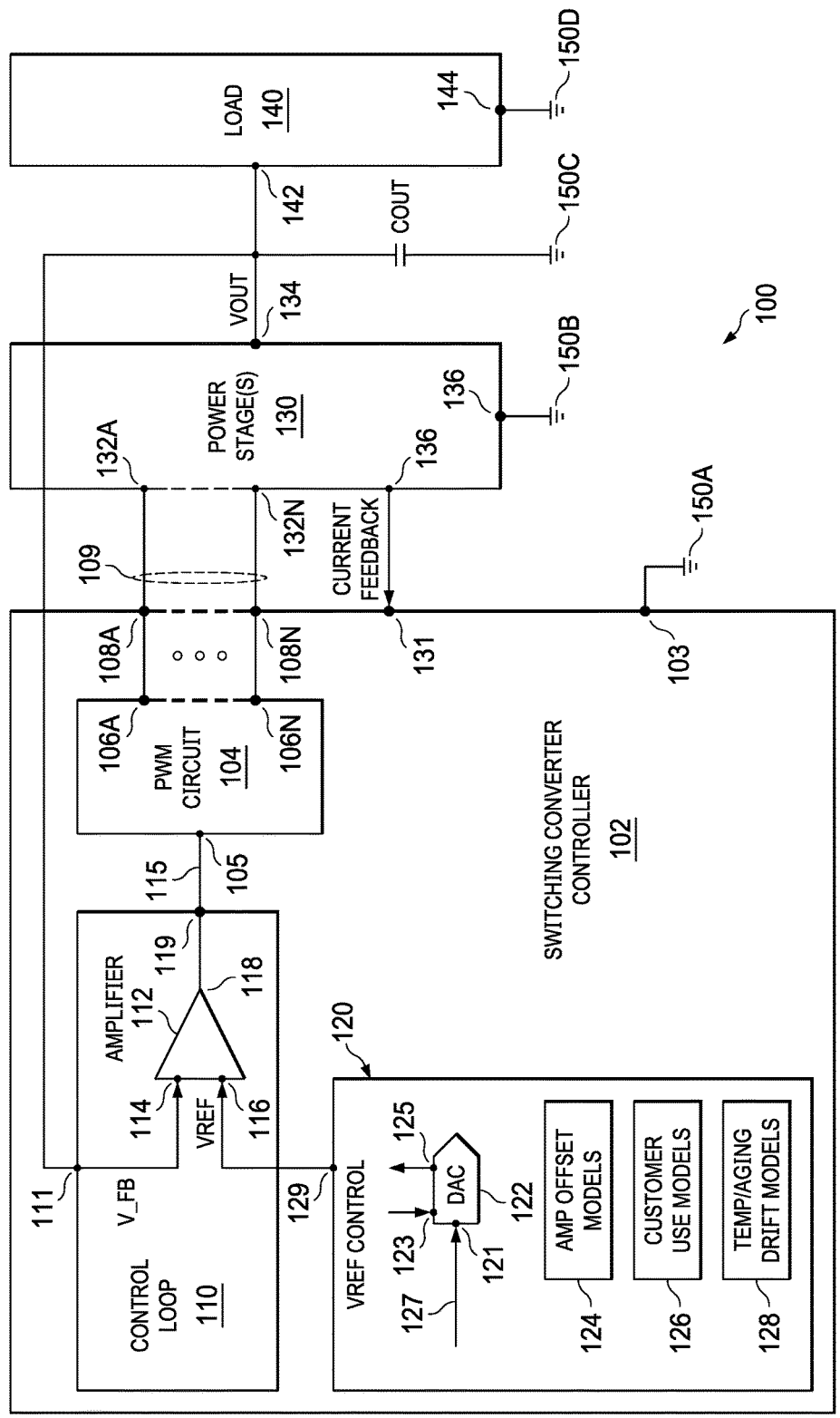
FIG. 1 is a block diagram of a system in accordance with an example embodiment.

FIG. 1 is a block diagram of a system 100 in accordance with an example embodiment. In some example embodiments, the system 100 is end-equipment such as an enterprise server, a storage device, or a networking device. As shown, the system 100 includes a switching converter controller 102 coupled to power stage(s) 130. The stage controller 102 is configured to provide control signals 109 (e.g., pulse width modulation (PWM), pulse frequency modulation (PFM) or any other type of continuous conduction mode (CCM) or discontinuous conduction mode (DCM) control signals) to the power stage(s) 130 control respective switches (not shown) of the power stage(s). By adjusting the on-time and off-time of power stage switches as needed, VOUT provided by the power stage(s) 130 is maintained at a target voltage for use by the load 140. In some examples, the load 140 is a central processing unit (CPU) or other variable load (such as any of the devices used in networked computing). Over time, the switching converter controller 102 adjusts the control signals 109 to maintain VOUT at a target VOUT as the load current to the load 140 varies. In some example embodiments, the power stage(s) 130 has a single-phase converter topology and the switching converter controller 102 provides control signals 109 for the single-phase converter topology. In other example embodiments, the power stage(s) 130 have a multi-phase converter topology and the switching converter controller 102 provides control signals 109 for a multi-phase converter topology. In some example embodiments, power stage 130 includes a high-side switch (e.g. a metal-oxide-silicon field effect transistor (MOSFET), a bipolar junction transistor (BJT), a diode or other similar device) and/or a low-side switch (e.g. a MOSFET, BJT, diode or other similar device) and, in some example embodiments, one or more passive devices, e.g. inductor (such as LOUT in FIG. 3) or capacitor.

More specifically, in the example of FIG. 1, the switching converter controller 102 includes a PWM circuit 104 with a PWM control input 105 and PWM circuit outputs 106A-106N. In operation, the PWM circuit 104 is configured to provide the control signals 109 at the PWM circuit outputs 106A-106N responsive to a control signal 115 provided to the PWM control input 105 by the control loop 110.

The control loop 110 includes an operational amplifier 112 with a feedback input 114, a reference voltage input 116, and an amplifier output 112. The feedback input 114 is coupled to a feedback voltage input 111 of the control loop 110. In some example embodiments, the feedback voltage input 111 is coupled to an output terminal 134 of the power stage(s) 130. The system 100 may also include a voltage divider or other scaling circuit so that the feedback voltage (V_FB) provided to the feedback input 114 is proportional to VOUT.

In the example embodiment of FIG. 1, the reference voltage controller 120 includes a DAC 122 and a reference voltage output 129. More specifically, the DAC 122 includes a DAC code input 121, a DAC reference voltage input 123, and a DAC output 125. The DAC code input 121 receives a control signal 127 (e.g., a DAC code) responsive to a dynamic error estimate determined by the reference voltage controller 120. In the example embodiment of FIG. 1, the dynamic error estimate is a function of amplifier models 124, customer use models 126, and/or temperature/aging drift models 128. Accordingly, the reference voltage controller 120 may include error estimation and correction components to provide the control signal 127 responsive to the amplifier models 124, the customer use models 126, and the temperature/aging drift models 128 and related parameters. Additionally or alternatively, the dynamic error estimate may account for known errors in the error estimation components or related parameters. Regardless of the particular error estimation models or components used, the control signal 127 is dynamically adjusted to account for at least some VOUT error introduced by the control loop 110. By adjusting the control signal 127 responsive to the dynamic error estimate, the reference voltage (VREF) provided to the DAC output 125, the voltage reference output 129, the reference input 116, and/or other components of the control loop 110 reduces the amount of VOUT error.

Responsive to V_FB at the feedback input 114 and VREF at the reference input 116, the operational amplifier 112 is configured to provide a control signal 115 at the amplifier output 118. The control signal 115 at the amplifier output 118 is provided to the PWM control input 105 via a control loop output 119. Responsive to the control signal 115, the PWM circuit 105 provides the control signals 109 to power stage inputs 132A-132N of the power stage(s) 130 via PWM circuit outputs 106A-106N and switching converter controller outputs 108A-108N of the switching converter controller 102.

As shown, the switching converter controller 102 also includes a feedback current reference input 131 coupled to a feedback current reference output 136 of the power stage(s) 130. In some example embodiments, the PWM circuit 104 includes another control input and the control loop 110 includes a current feedback control circuit (see e.g., the current feedback control circuit 410 in FIG. 4). In such embodiments, the current feedback control circuit is configured to provide a current feedback sense signal to the other control input of the PWM circuit 104 responsive to a current feedback reference signal received by the current feedback reference input 131.

In FIG. 1, various ground inputs are shown to provide a ground for each of the switching converter controller 102, the power stage(s) 130 and the load 140. More specifically, the switching converter controller 102 includes a ground input 103 coupled to a ground 150A. Power stages(s) 130 includes a ground input 136 coupled to a ground 150B, and the load 140 includes a ground input 144 coupled to ground 150D. System 100 includes an output capacitor (COUT) with a first plate coupled to the power stage output 134 and a load input 142 of the load 104. The second plate of COUT is coupled to a ground 150C.

To summarize, the switching converter controller 102 of the system 100 includes circuitry configured to: determine a dynamic error estimate of VOUT error attributable to the control loop 110 and provide a correction responsive to the determined dynamic error estimate. In the example embodiment of FIG. 1, the dynamic error estimation and correction is performed by a reference voltage controller 120 of the control loop 110. More specifically, the reference voltage controller 120 includes various error models or related circuitry to determine the dynamic error estimate as well as the DAC 122, which enables corrections responsive to the dynamic error estimate. In other examples, the dynamic error estimation and correction is performed in another way. In some example embodiments, switching converter controller 102 may be implemented on a single semiconductor die while power stage 130 may be implemented, at least partially, on another semiconductor die. Alternatively, both switching converter controller 102 and power stage 130 may be implemented on the same semiconductor die or the same device package with the passive components (such as inductors and/or capacitors) being implemented on the semiconductor die or as separate components.

Figure 2:
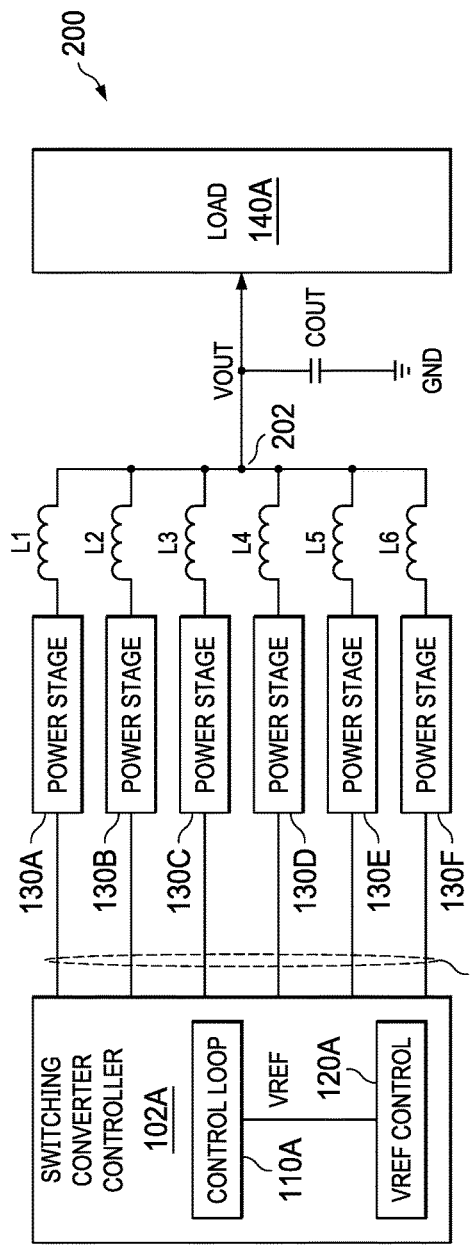
FIG. 2 is a block diagram of a system with a multi-phase converter topology in accordance with an example embodiment.

FIG. 2 is a block diagram of a system 200 with a multi-phase converter topology in accordance with an example embodiment. As shown, the system 200 includes a switching converter controller 102A (an example of the switching converter controller 102 in FIG. 1). The switching converter controller 102A includes a control loop 110A (an example of the control loop 110 in FIG. 1) with a reference voltage controller 120A (an example of the reference controller 120 in FIG. 1). The reference voltage controller 120A performs dynamic error estimation and correction to account for at least some VOUT error attributable to the control loop 110A. Responsive to the dynamically adjusted reference voltage used by the control loop 110A, the switching converter controller 102A provides PWM signals 109A (an example of the control signals 109 in FIG. 1) to parallel power stages 130A-130F in FIG. 2. As shown, the system 200 includes a respective inductor (L1-L6) at the output of each of the parallel power stages 130A-130F. Specifically, L1 is coupled between the power stage 130A and an output node 202. L2 is coupled between the power stage 1306 and the output node 202. L3 is coupled between the power stage 130C and the output node 202. L4 s coupled between the power stage 130D and the output node 202. L5 is coupled between the power stage 130E and the output node 202. L6 is coupled between the power stage 130F and the output node 202. With the multi-phase converter topology (parallel power stages 130A-130F), the total amount of load current that can be provided to the load 140A (an example of the load 140) while maintaining VOUT is increased relative to a single-phase converter topology.

Figure 3:
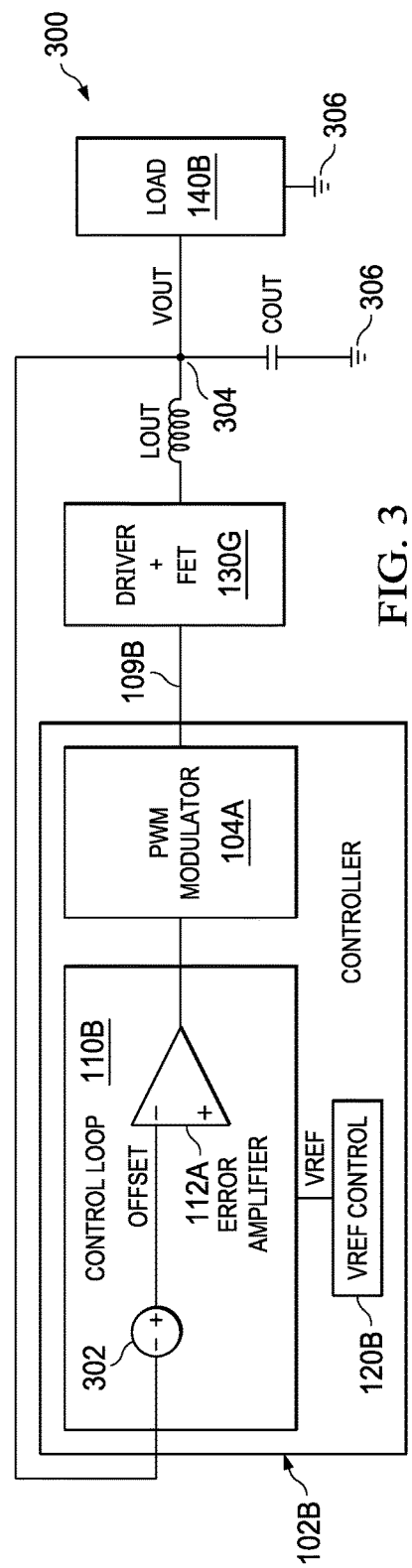
FIG. 3 is a diagram of components of a system with a single-phase converter topology in accordance with an example embodiment.

FIG. 3 is a diagram of components of a system 300 with a single-phase converter topology in accordance with an example embodiment. As shown, the system 300 includes a switching converter controller 1028 (an example of the switching converter controller 102 in FIG. 1). The switching converter controller 102B includes a control loop 1108 (an example of the control loop 110 in FIG. 1) with a reference voltage controller 120B (an example of the reference controller 120 in FIG. 1). In the example of FIG. 3, the control loop 1108 includes an operational amplifier 112A (an example of the operational amplifier 112 in FIG. 1). The operational amplifier 112A also includes an offset circuit 302 configured to apply an offset to VOUT, where VOUT plus the offset is input to the inverting input of the operational amplifier 112A. The non-inventing input of the operational amplifier 112A receives VREF from the reference voltage controller 120B. In operation, the reference voltage controller 120B performs dynamic error estimation and correction to account for at least some VOUT error attributable to the control loop 1108. Responsive to the dynamically adjusted reference voltage used by the control loop 1108, the switching converter controller 102B provides PWM signals 109B (an example of the control signals 109 in FIG. 1) to a power stage 130G (e.g., a driver and FETs). As shown, the system 300 includes an inductor LOUT at the output of the power stage 130G. Specifically, LOUT is coupled between the power stage 130G and the output node 304. With the single-phase converter topology (power stage 130G), the complexity is decreased and total amount of load current that can be provided to the load 140B (an example of the load 140) while maintaining VOUT is decreased relative to a multi-phase converter topology (e.g., see system 200 in FIG. 2).

Figure 4:
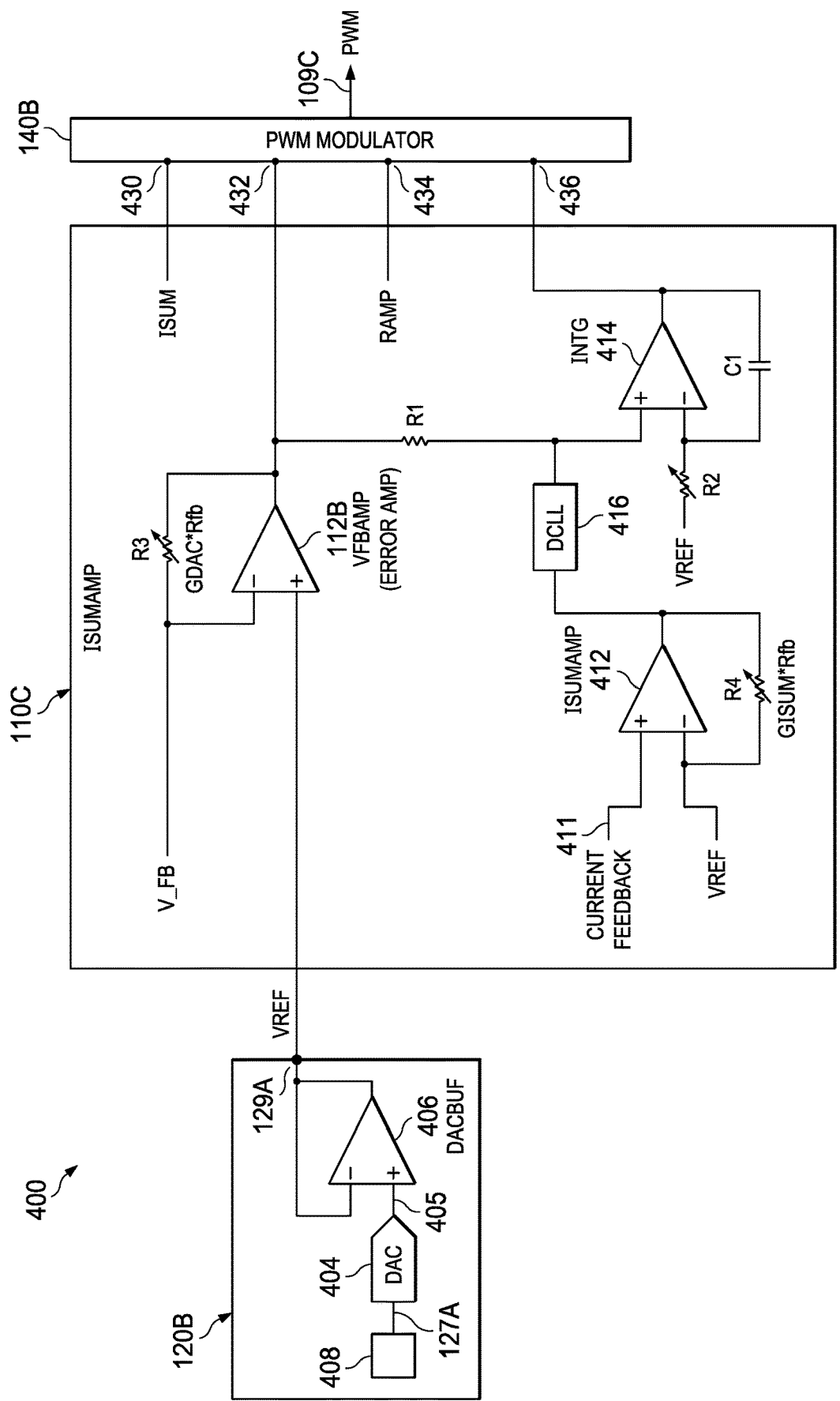
FIG. 4 is a schematic diagram of a control loop in accordance with an example embodiment.

FIG. 4 is a schematic diagram of a control loop 110C (an example of the control loops 110, 110A, and 110B in FIGS. 1-3) in accordance with an example embodiment. In the example of FIG. 4, the control loop 110C is coupled to a PWM circuit 140B (labeled PWM modulator in FIG. 4) with control inputs including: a summed current (ISUM) control input 430; a feedback voltage control input 432; a ramp control input 434; and a feedback current control input 436. As shown, the output of the PWM circuit 140B is PWM signals 109C (an example of the control signals 109 in FIG. 1) for use by one or more power stages.

In the example embodiment of FIG. 4, the control loop 110C includes a first operational amplifier 112B (an example of the operational amplifier 112 in FIG. 1). As shown, the inverting input of the first operational amplifier 112B receives V_FB. The first operational amplifier 112B also receives VREF at its non-inverting input from a reference voltage controller 120B (an example of the reference voltage controller 120 in FIG. 1). Also, between the output of the first operational amplifier 112B and its inverting input is a feedback loop with a resistor R3. In some example embodiments, the value of R3 is a function of GDAC*Rfb, where GDAC is the gain of the first operational amplifier 112B, and Rfb is a predetermined resistor value for the feedback loop of the first operational amplifier 112B. In different example embodiments, the value of Rfb for the first operational amplifier 112B may be selected to comply with a target criteria for amplifier stability, frequency response, step response, gain of the closed loop, linearity, and/or sensitivity to system variations. In FIG. 4, the reference voltage controller 120B includes a DAC 404 configured to output a reference voltage 405 responsive to a control signal 127A (an example of the control signal 127 in FIG. 1). The control signal 127A is provided by circuitry 408 configured to perform dynamic error estimation and correction operations. In different examples, the circuitry 408 employs error models (e.g., the models 124, 126, 128 in FIG. 1) that are stored in memory in circuitry 408 and based on measurements taken during assembly and testing of the device and/or models derived from component modeling In some example embodiments, circuitry 408 includes memory, a processor or state machine and/or other components to perform dynamic error estimation. Once the dynamic error estimation is determined, the circuitry 408 adjusts the control signal 127A to enable an appropriate correction to the dynamic error estimation.

In FIG. 4, DAC 404 adjusts reference voltage 405 output based on control signal 127A. In the example embodiment of FIG. 4, the reference voltage 405 is buffered by an amplifier 406 (such as an operational amplifier with its inverting input coupled to the output of the operational amplifier) with the input coupled to the DAC 404 and configured to receive the reference voltage 405. The output of the amplifier 406 is VREF.

As shown, the control loop 110C also includes a third operational amplifier 412. The non-inverting input of the third operational amplifier 412 receives a current feedback sense signal 411. In one example, the current feedback sense signal 411 is provided by a power stage (e.g., from feedback current reference output 136 of the power stage(s) 130 in FIG. 1) and related current monitoring circuitry. The inverting input of the third operational amplifier 412 receives VREF from the reference voltage output 129A. The inverting input of operational amplifier 412 is connected to the output of operational amplifier 412 by resistor R4 to form a feedback loop. In some example embodiments, the value of R4 is a function of GISUM*Rfb, where GISUM is the gain of the third operational amplifier 412, and Rfb is a predetermined resistor value in the feedback loop of the third operational amplifier 412. In different example embodiments, the value of Rfb for the third operational amplifier 412 may be selected to comply with a target criteria for amplifier stability, frequency response, step response, gain of the closed loop, linearity, and/or sensitivity to system variations.

The output of the third operational amplifier 412 is provided to a direct-current loadline (DCLL) block 416 configured to provide a loadline setting. In some example embodiments, the DCLL block 416 is a configurable voltage source that adjusts the output of the third operational amplifier 412 to account for a customer's preferred DC loadline setting, which may vary for different customers. The output of the DCLL block 416 is coupled to: the output of the first operational amplifier 1126 via a resistor R1 and the non-inverting input of a fourth operational amplifier 414 (included with the current feedback control circuit 410). The inverting input of the fourth operational amplifier 414 receives a scaled version of VREF responsive to the value of an adjustable resistor R2. Capacitor C1 connects the inverting input of operational amplifier 414 with the output of the operational amplifier 414 to form a feedback loop. As shown, the output of the fourth operational amplifier 414 is coupled to the feedback current control input 436 of the PWM circuit 104B via the current feedback sense output 422.

Operational amplifiers 112B, 406, 412, and 414 have offset and gain error that contribute to VOUT error. Accordingly, in some example embodiments, the circuitry 408 determines a dynamic error estimate based, in part, on the errors produced by the operational amplifiers 112B, 406, 412, and 414. Additionally, in some example embodiments, the circuitry 408 determines a dynamic error estimate by determining a dynamic offset contribution from control loop components responsive to customer use parameters such as loadline, number of active phases, VOUT range, and load current. In some example embodiments, the circuitry 408 also determines a dynamic error estimate taking into account a dynamic output shift due to temperature and/or aging of control loop components.

In some example embodiments, dynamic error estimation involves VOUT error budgeting. An example VOUT error budget is given as:

$$\text{VOUT} = \text{VDAC} - I_{load} * DC_{LL} \quad (1)$$

where VDAC is the voltage output from the DAC 122 in FIG. 1, $I_{load}$ is the load current, and DCLL is the DC loadline. In the example of FIG. 4, the above VOUT error budget is used up by offset error of the fourth operational amplifier 414. Accordingly, the offset of any component before the fourth operational amplifier 414 adds towards steady state VOUT error beyond the VOUT error budget.

In some examples, components in a control loop (e.g., the control loop 110C in FIG. 4) that add to VOUT error include analog buffer (e.g., DACBUF or the second operational amplifier 406 in FIG. 4) at the output of the DAC 404. Any offset in DACBUF directly adds to VOUT error. In some example embodiments, dynamic error estimation accounts for error due to DACBUF using the model:

$$V_{err,VDAC} = \text{DACBUF}_{OFFSET} \quad (2)$$

where $\text{DACBUF}_{OFFSET}$ is the offset due to DACBUF. Another component in a control loop (e.g., the control loop 110C in FIG. 4) that adds to VOUT error includes an error amplifier (labeled VFBAMP or the first operational amplifier 112B in FIG. 4). The output of VFBAMP is VDAC minus VOUT. Accordingly, offset in VFBAMP adds directly to VOUT error. Also, VFBAMP can have multiple gain settings, so the offset error applied to the output changes with gain. In some example embodiments, dynamic error estimation accounts for error due to VFBAMP using the model:

$$V_{err,Vfbamp} = \text{GDAC} * \text{VFBAMP}_{OFFSET} \quad (3)$$

where GDAC is the gain of VFBAMP and $\text{VFBAMP}_{OFFSET}$ is the offset due to VFBAMP.

Current feedback loop amplifier (labeled ISUMAMP or the third operational amplifier 412 in FIG. 4) may, also, add to VOUT error. The output of ISUMAMP is the sum of individual phase currents. The gain of ISUMAMP changes with the number of active phases, and the offset contribution changes. Accordingly, different gain settings are used to limit the swing of ISUMAMP depending on the load current. In some example embodiments, dynamic error estimation accounts for error due to ISUMAMP using the model:

$$V_{err,ISUMAMP} = \text{ISUMDC}_{OFFSET} * \text{GISUM} * N_{ph} * DC_{LL} \quad (4)$$

where GISUM is the gain of ISUMAMP, $N_{ph}$ is the number of active phases, $DC_{LL}$ is the loadline.

The Integrator (labeled INTG or the fourth operational amplifier 414 in FIG. 4) in control loop 110C also adds to VOUT error. The offset contribution of INTG changes depending on the GISUM configuration. In some example embodiments, the portion of the dynamic error estimation relating to INTG is determined by:

$$V_{err,INTG} = \text{INTG}_{OFFSET} * \text{GISUM} \quad (5)$$

where GISUM is the gain of ISUMAMP, and $\text{INTG}_{OFFSET}$ is the offset of INTG.

In some example embodiments, the dynamic error estimation for error in DACBUF, VFBAMP, ISUMAMP, and INTG is provided by:

$$\begin{aligned}\text{VOUT}_{Error} = &\text{DACBUF}_{OFFSET} + \\ &\text{GDAC}*\text{VFBAMP}_{OFFSET} + \\ &\text{GISUM}*\text{ISUMAMP}_{OFFSET}*N_{PH}*DC_{LL} + \\ &\text{GISUM}*\text{INTG}_{OFFSET}\end{aligned} \quad (6)$$

where $\text{VOUT}_{Error}$ is the total error of these control loop components. In one example, a load current change from 200 A to 600 A results in the number of active phases changing from 4 to 12, and in GISUM changing from 1 to 0.5. These changes to the number of active phases and the value of GISUM at 600 A provide a different offset value than when load current is at 200 A. One previous technique to address VOUT error is referred to VOUT trimming. This type of trimming is performed under one set of conditions. However, trimming VOUT under a single set of conditions to remove loop offset does not work in some scenarios (e.g., in a multiphase controller scenario). Accordingly, in contrast to the limitations of a fixed point trim, one benefit of the described models is that the dynamic error estimation and correction will apply to different scenarios. Also, the described dynamic error estimation and correction may account for some or all amplifier output changes across temperature. Also, the described dynamic error estimation and correction may account for offset variation and output shift due to aging.

Another option to perform VOUT error correction is individual operational amplifier offset cancellation. As the offset contribution changes with device configurations, one possible solution can be to trim individual operational amplifier offsets to very low values, so that the change in offsets due to change in configurations does not add significant error. With this option, each amplifier needs very low offset (such as less than 50 µV). Such tight accuracy with feedback gain makes the input referred offset target even more difficult to meet. Also, using offset trimming circuitry at the input of each amplifier makes block design challenging due to added parasitic poles, causing stability issues. In this example option, a trimming network to achieve 50 µV resolution would take significant die area. Also, individual trimming on automatic test equipment (ATE) is needed, which increases test costs.

In some example embodiments, the described dynamic error estimation and correction provides VOUT trim accuracy without the limitations of the individual amplifier trims. In one example embodiments, a 13-bit DAC (e.g., the DAC 404) is used to generate the reference voltage for a control loop (e.g., the control loop 110C in FIG. 4). In some example embodiments, a 13-bit DAC provides a step-size resolution of 250 uV. Instead of using trims for individual offset correction, the DAC voltage can be adjusted (thereby adjusting the reference voltages applied to the operational amplifiers) with a step of 250 uV to compensate for all operational amplifier offsets. Also, in some example embodiments, final assembly/test equipment is used to trim the DAC to an accuracy of ½ the least significant bit (LSB), or 125 uV in the example. As offset contribution changes dynamically, DAC offset correction logic is implemented according to the dynamic error estimate to the adjust the DAC output as described herein. In one example embodiment, the offset of each operational amplifier of the control loop 110C is measured by an ATE and is stored for later use by the circuitry 408 to determine the dynamic error estimate and provide a correction.

Figure 5:
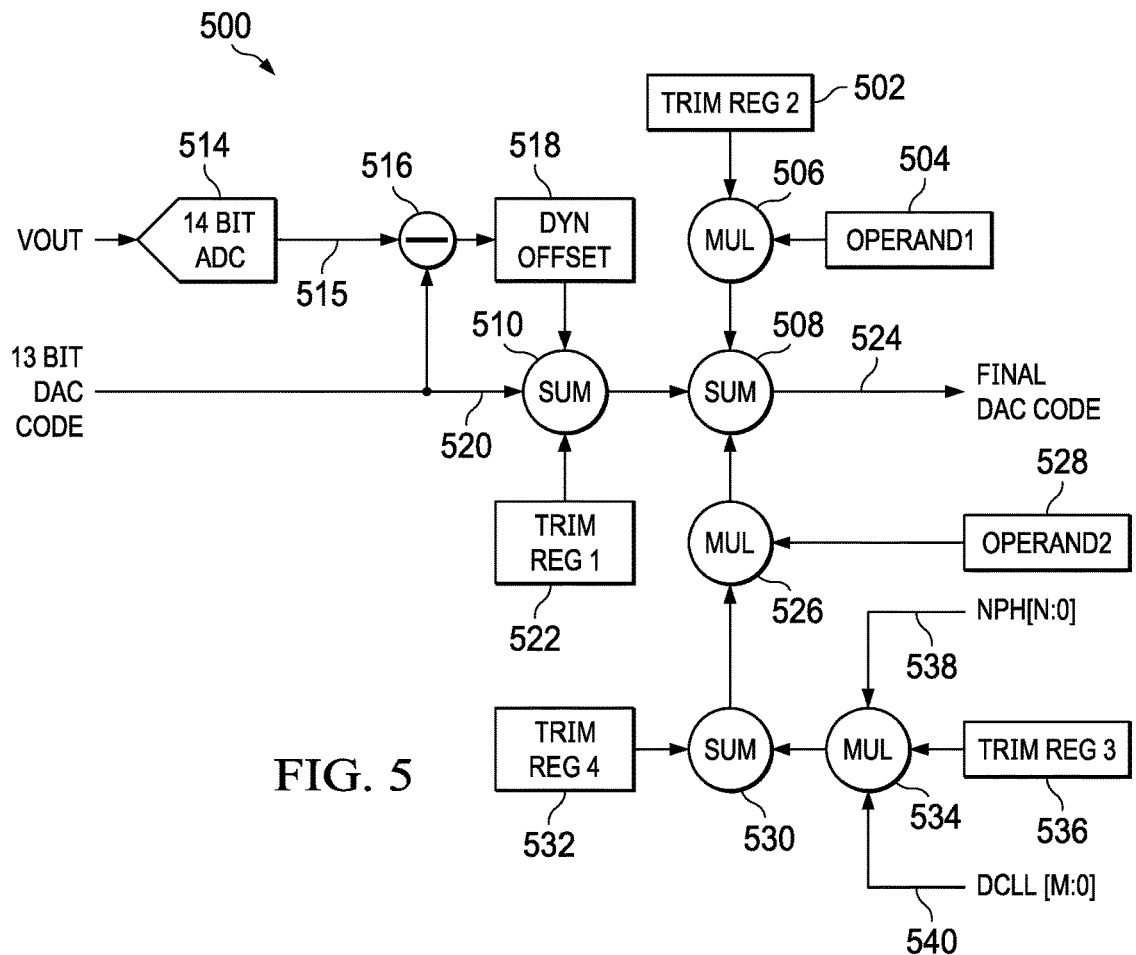
FIG. 5 is a diagram of dynamic error estimation and correction blocks for a reference voltage controller in accordance with an example embodiment.

FIG. 5 is a diagram of dynamic error estimation and correction blocks 500 for a reference voltage controller (e.g., the reference voltage controller 120 in FIG. 1, the reference voltage controller 120A in FIG. 2, the reference voltage controller 120B in FIG. 3, or the reference voltage controller 120B in FIG. 4) of a switching converter controller (e.g., the switching converter controller 102 in FIG. 1, the switching converter controller 102A in FIG. 2, or the switching converter controller 102B in FIG. 3) in accordance with an example embodiment. In FIG. 5, functional blocks 500 represent the operations to perform dynamic error estimation and correction (e.g., the blocks 500 are an example of the circuitry 408 in FIG. 4 or related operations). Such functional blocks 500 may be implemented solely in hardware or as a combination of hardware (such as a processor, memory, state machine, digital-to-analog converter, logic circuitry and other circuitry) and software. As shown, the blocks 500 include an analog-to-digital converter (ADC) 514 (e.g., a 14-bit ADC) configured to receive VOUT and provide digital code 515 representing VOUT. The digital code 515 is output to a subtraction block 516, which subtracts the digital code 515 from a DAC code 520 (e.g., a 13-bit DAC code that accounts for error estimation) as a calibration. The output of the subtract block 516 is provided to a dynamic offset block 518, which provides dynamic VOUT error calibration. In some example embodiments, the ADC 514 has a resolution of 120 uV, a differential nonlinearity (DNL) of ½ LSB, and a maximum integral nonlinearity (INL) of 2 LSB.

As shown, the blocks 500 also includes a summation block 510 configured to combine the DAC code 520 with the output of the dynamic offset block 518 and a trim register value stored by trim register 522 (representing a dynamic error estimation value that accounts for offset due to DACBUF—this value may be stored as part of the measurements taken during assembly/test of the device or as a result of device modeling). The output of the summation block 510 is provided as one of the inputs to summation block 508. In the example of FIG. 5, the operations involving the ADC 514, the subtraction block 516, the dynamic offset block 518, and the summation block 510 provide a dynamic error estimation value that accounts for temperature and aging shifts.

As shown, the summation block 508 also receives the output from a multiplication block 506 as another input. Specifically, the multiplication block 506 is configured to multiply a GDAC value from operand block 504 with a VFBDAC value from trim register 502. In some example embodiments, the value of GDAC is a device configuration which changes to support different VOUT and load current scenarios, which changes the offset contributions of control loop operational amplifiers. This GDAC value may be stored in memory as a result of prior measurements, modeling and/or device specifications. In the example of FIG. 5, the operations involving the multiplication block 506, the operand block 504, and the trim register 502 provide a dynamic error estimation value that accounts for offset due to VFB-AMP.

As shown, the summation block 508 also receives the output from a multiplication block 526 as another input. Specifically, the multiplication block 526 is configured to multiply a GISUM value from operand block 528 with the output of a summation block 530. In some example embodiments, the value of GISUM is a device configuration, which changes to support different VOUT and load current scenarios. With these different VOUT and load current scenarios, the offset contributions of control loop operational amplifiers vary. In some example embodiments, a current or target GISUM value may be stored in memory, or may be selected from a range of GISUM values, as a result of prior measurements, modeling and/or device specifications. The summation block 530 combines an INTG value (resulting from prior measurements, modeling and/or device specifications and representing the gain of the fourth operational amplifier 414) from trim register 532 with the output of a multiply block 534. The inputs to the multiply block 534 include an ISUMAMP value (resulting from prior measurements, modeling and/or device specifications and representing the gain of the third operational amplifier 412) from trim register 536, number of active phases value (labeled NPH [N:0]), and a loadline setting (labeled DCLL[M:0]). In the example of FIG. 5, the values of NPH[N:0] and DCLL[M:0] vary depending on the total load current and application (customer use) scenario. In the example of FIG. 5, the operations involving the multiplication block 506, the operand block 528, the summation block 530, the trim register 532, the multiplication block 534, and the trim register 536 provide a dynamic error estimation value that accounts for offset due to operational amplifiers of a feedback current control circuit (e.g., the feedback current control circuit 410 in FIG. 4).

In some example embodiments, dynamic error estimation operations and correction also account for ADC INL error and gain error removal. Since ADC reference shifts and bandgap shifts are proportional, the ADC code from the ADC 514 should be the same irrespective of bandgap shift. Assuming that there is a bandgap shift at a first time of $(V_{bg1})=V$ and a related ADC reference shift at the first time of (VBG1$_{ADC}$)=V*2$^N$/V$_{ADCREF}$, a condition may exist where, at a later second time, that the bandgap is $$(V_{bg2})=(1+\alpha)*Vbg \tag{7}$$

where α is the drift in bandgap due to temperature/aging. Also, the ADC reference shift at the second time is $$(VBG2_{ADC})=(1+\alpha)*V_{BG}*2^N/(1+\alpha)*V_{ADCREF}=V_{BG}*2^N/V_{ADCREF} \tag{8}$$

Due to ADC error, the ADC code is $$VBG2_{ADC\_1}=V_{BG}*2^N/V_{ADCREF}+\gamma \tag{9}$$

where γ is the error in ADC which is adjusted in V$_{ADCREF}$ to obtain a code the same as VBG$_{ADC}$.

In some examples, the dynamic error estimate accounts for ADC error using the following If VOUT$_{ideal}$=VOUT, then $$VOUT_{drift}=(1+\alpha)*VOUT+V_{offset} \tag{10}$$

where α is bandgap temperature coefficient, and V$_{offset}$ is the offset drift in the control loop due to temperature drift. In such case, error due to temp drift is $$\alpha*VOUT+V_{offset} \tag{11}$$

Also, $$ADC_{ideal}=VOUT*2^N/V_{ADCREF} \tag{12}$$

and $$ADC_{drift}=((1+\alpha)*VOUT+V_{offset})*2^N/(1+\alpha)*V_{ADCREF} \tag{13}$$

With these models, the total error that can be corrected is:

$$ADC_{drift}-ADC_{ideal}=1/(1+\alpha)*V_{offset}*2^N/V_{ADCREF}=(1-\alpha)*V_{off}*2^N/V_{ADCREF} \tag{14}$$

If bandgap is ideal α=0, all the offset error (V$_{offset}$) can be corrected. In another example, α=0.25%, and 0.9975*V$_{offset}$ can be corrected. Taking an example of VOUT=1 V, if there is a 0.25% bandgap drift, error at output due to bandgap would be 1*0.0025=2.5 mV. If the offset drift due to temp=2 mV, then the total error in VOUT due to temperature shift is 2.5 mV+2 mV=4.5 mV. Out of this 4.5 mV, 2 mV can be compensated. Accordingly, specification accuracy can be improved to bandgap accuracy, which is less than 0.5%.

Figure 6:
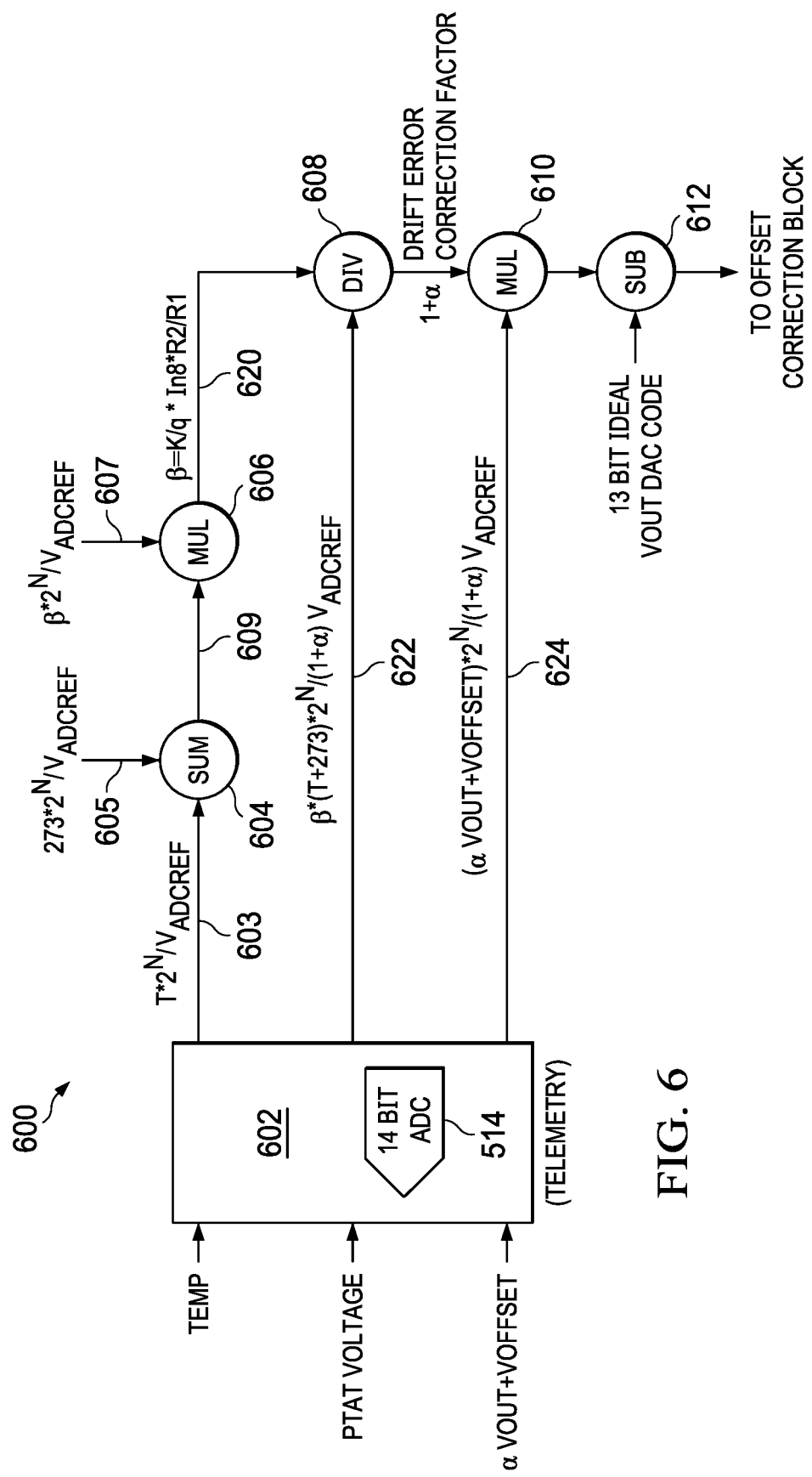
FIG. 6 is another diagram of dynamic error estimation and correction for a reference voltage controller to account for temperature and aging drift in accordance with an example embodiment.

FIG. 6 is another diagram of dynamic error estimation and correction blocks 600 for a reference voltage controller (e.g., the reference voltage controller 120 in FIG. 1, the reference voltage controller 120A in FIG. 2, the reference voltage controller 120B in FIG. 3, or the reference voltage controller 120B in FIG. 4) in accordance with an example embodiment. In FIG. 6, the functional blocks 600 represent operations to perform dynamic error estimation and correction (e.g., the blocks 600 are an example of the circuitry 408 in FIG. 4 or related operations). In FIG. 6, the dynamic error estimation and correction blocks 600 includes a telemetry block 602 that includes the ADC 514. Functional blocks 600 may be implemented solely in hardware or as a combination of hardware (such as a processor, memory, state machine, digital-to-analog converter, logic circuitry and other circuitry) and software.

In the example of FIG. 6, functional blocks 600 are used to calibrate bandgap drift. As shown, the inputs to the telemetry block 602 include a temperature measurement (TEMP), a proportional to absolute temperature (PTAT) voltage, and a value for error due to temperature drift (α *VOUT+V$_{offset}$). The outputs of the telemetry block include a first value 603 (a digital output from the ADC 514 for the TEMP input and given as T*2$^N$/V$_{ADCREF}$), a second value 622 (a digital output from the ADC 514 for the PTAT voltage and given as β*(T+273)*2$^N$/(1+α) V$_{ADCREF}$), and a third value 624 (the output of the ADC for VOUT with drift due to bandgap and given as (α *VOUT+V$_{offset}$)*2$^N$/(1+α) V$_{ADCREF}$). The first value 603 is provided to a summation block 604, which combines the first value 603 with value 605 (273*2$^N$/V$_{ADCREF}$). The output 609 of the summation block 604 is provided to multiplication block 606 and is multiplied by value 607 (β*2$^N$/V$_{ADCREF}$), where β=K/q*ln8*R2/R1. The output 620 of the multiplication block 606 is a calculated PTAT value (e.g., the summation block 604 and the multiplication block 606 represent a post processing technique) to obtain the output 620 from the first value 603, where the output 620 is provided to a division block 608. The division block 608 divides the second value 622 by the output 620 of the multiplication block 606 to compare the PTAT voltage with the calculated PTAT corresponding to output 620 as a ratio. The output of the division block 608 is a drift error correction factor (represented as 1+a), which is provided to a multiplication block 610. The multiplication block 610 multiplies the third value 624 by the drift error correction factor. The output of the multiplication block 610 is provided to a subtraction block 612, which subtracts a DAC code (e.g., a 13-bit ideal VOUT DAC code) representing an ideal VOUT from the output of multiplication block 610. The output of the subtraction block 612 is provided to an offset correction block (e.g., the dynamic offset block 518 in FIG. 5) so that error estimation accounts for bandgap drift.

With the dynamic error estimation and correction blocks 600, PTAT voltage is processed in one ADC channel, and temperature (TEMP) from a thermal sensor processed through another ADC channel. An ideal PTAT voltage is also computed using die temperature information through the temperature channel. The ideal PTAT code is compared against a PTAT voltage channel ADC code to calibrate drift due to bandgap.

For a given voltage, V, the ADC code when bandgap drift is 0 will be ADC$_v$=V*2$^N$/V$_{ADCREF}$. With bandgap drift of α, ADC$_v$=V*2$^N$/(1+α)V$_{ADCREF}$, so the gain error term due to bandgap drift is 1+α. This error factor is computed using two ADC channels. In some example embodiments, the ADC code at temp T is ADC$_T$=T*2$^N$/V$_{ADCREF}$, where a is the drift co-efficient due to bandgap. From the PTAT equation, $$V_{PTAT}=KT/q*\ln 8*R2/R1=\beta*(273+T) \tag{15}$$

where β=K/q*ln8 (β is a constant term). The ADC code for PTAT voltage at a given temperature T would be $$ADC_{PTAT}=V_{PTAT}*2^N/(1+\alpha)V_{ADCREF} \tag{16}$$

Also, $$ADC_{PTAT}=\beta*(273+T)*2^N/(1+\alpha)V_{ADCREF} \tag{17}$$

At temp=T, the calculated ADC code for PTAT voltage would be $$ADC_{PTAT\_cal}=\beta*(ADC_T+273) \tag{18}$$

Also, $$ADC_{PTAT\_cal}=\beta*(T_1+273)*2^N/V_{ADCREF} \tag{19}$$

Dividing Equation (18) by Equation (17), $$ADC_{PTAT\_cal}/ADC_{PTAT}=[(T_1+273)/(T+273)]*(1+\alpha) \tag{20}$$

Also, designating (T1+273)/(T+273) as x, the correction factor becomes x*(1+α). As an example, if there is 1% error between the actual and the calculated values, at T=100C, $T_1$ could be 99, so the correction factor=0.997*(1+a). At T=25 Celsius, the temperature error would be 0.25 degrees Celsius, and the correction factor=0.99916*(1+a). At room temperature, the correction factor is close to ideal value. This shows that non-temperature dependant drift (like aging) can be calibrated with better accuracy. The value of x that can be tolerated will depend on the value of a. If a is very small, x needs to be very accurate. This will eventually decide the inaccuracy in temperature that can be tolerated. Depending on the value of x, a calculated correction factor can correct drift error or can actually over-compensate.

In other example embodiments, bandgap drift calibration is performed as follows: 1) the customer provides a good reference voltage with very little variation (<10 part per million (ppm) when VREF is 1.25V); 2) during board level testing, an external voltage reference is measured through an ADC at different temperatures; 3) the difference in ADC code between room temperature and the different test temperatures relative to room temperature gives the error in the ADC due to temperature drift; and 4) error codes are saved in device memory and are used to cancel out drift error during later operations. In some example embodiments, the ADC used with dynamic error estimation and correction is part of an IC's telemetry hardware needed for a multi-phase converter controller.

FIG. 7 is diagram 700 of temperature sensing using a metal resistor (R Metal) to perform dynamic error estimation and correction for a reference voltage controller in accordance with another example embodiment. In the diagram 700, a voltage divider with a first resistor (P1HSR) and $R_{Metal}$ are in series between a bandgap voltage (VBG) and a ground. In some example embodiments, the voltage between P1HSR and $R_{Metal}$ is provided to an ADC and can be used as a temperature measurement in accordance with the equations shown in the diagram 700.

Figure 8:
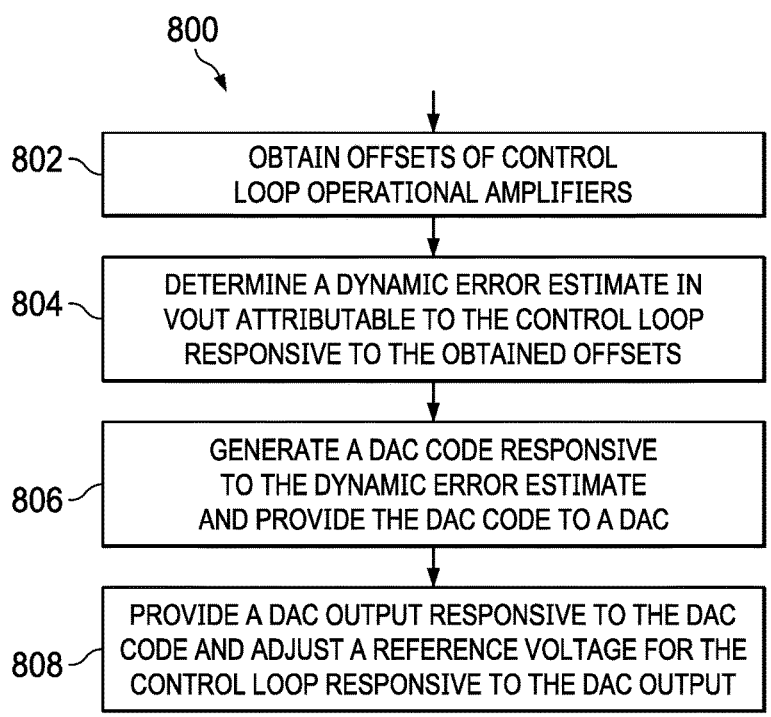
FIG. 8 is a flow chart of a method to perform dynamic error estimation and correction for a reference voltage controller in accordance with another example embodiment.

FIG. 8 is a flow chart of a method 800 to perform dynamic error estimation and correction for a reference voltage controller (e.g., the reference voltage controller 120 in FIG. 1, the reference voltage controller 120A in FIG. 2, the reference voltage controller 120B in FIG. 3, or the reference voltage controller 120B in FIG. 4) in accordance with an example embodiment. As shown, the method 800 includes obtaining offsets of control loop operational amplifiers at block 802. In one example, the offsets are obtained using test equipment, which is able to apply test voltages and currents at a first set of nodes of a circuit and measure voltages and currents at a second set of nodes of a circuit. In other example embodiments, modeling of circuit behavior is used to estimate the offsets. In other examples, offsets are determined in another way. At block 804, a dynamic error estimate in VOUT attributable to the control loop is determined responsive to the obtained offsets. At block 806, a DAC code is generated responsive to the dynamic error estimate and the DAC code is provided to a DAC. At block 808, a DAC output is provided responsive to the DAC code and a reference voltage for the control loop is adjusted responsive to the DAC output.

In some example embodiments, the method 800 includes additional or alternative operations. In some example embodiments, determining the dynamic error estimate at block 804 involves accounting for temperature drift or aging drift as described herein. In some example embodiments, determining the dynamic error estimate at block 804 involves accounting for error in an ADC used for dynamic error estimation and correction as described herein. In some example embodiment, determining the dynamic error estimate at block 804 involves accounting for the effect of loadline, number of active phases, an output voltage range, and a target load current on current loop operational amplifiers. Example current loop operational amplifiers include VFBAMP, DACBUF, ISUMAMP, and INTG in FIG. 4. Other control loop arrangements may vary. Also, other techniques to adjust a reference voltage may be possible.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

As used above, the terms "terminal", "node", "interconnection", "pin" are used interchangeably. Unless specifically stated to the contrary, these terms are generally used to mean an interconnection between or a terminus of a device element, a circuit element, an integrated circuit, a device or other electronics or semiconductor component.

Modifications are possible in the described embodiments, and other embodiments are possible, within the scope of the claims.

What is claimed is:

1. A controller, comprising:
    a pulse-width modulation (PWM) circuit having a PWM control input and a PWM circuit output;
    a control loop having:
        a feedback input adapted to be coupled to an output terminal of a power stage;
        a control loop output coupled to the PWM control input; and
        a first operational amplifier with a first feedback input, a first reference input, and a first amplifier output, wherein the first feedback input is connected to the feedback input, and the first amplifier output is coupled to the PWM control input; and
    a reference voltage controller configured to adjust a reference voltage provided to a reference voltage output responsive to a dynamic error estimate based on a voltage at the first amplifier output, the reference voltage controller including:
        a digital-to-analog converter (DAC) having a DAC code input, a DAC reference input and a DAC output, wherein the reference voltage controller is configured to adjust a voltage applied to the DAC reference input, and the DAC output is coupled to the first reference input; and
        a second operational amplifier having first and second op amp inputs and a second amplifier output, wherein the first op amp input is coupled to the DAC output, the second op amp input is coupled to the second amplifier output and the first reference input, and the dynamic error estimate accounts for error in the second operational amplifier.

2. The controller of claim 1, wherein the reference voltage controller uses an amplifier offset model to determine the dynamic error estimate.

3. The controller of claim 1, wherein the reference voltage controller uses a temperature drift model to determine the dynamic error estimate.

4. The controller of claim 1, wherein the control loop includes a third operational amplifier having a current feedback reference input, a second reference input and a current feedback amplifier output, the second reference input coupled to the reference voltage output, and the dynamic error estimate accounting for error in the third operational amplifier.

5. The controller of claim 4, wherein the PWM control input is a first PWM control input, the PWM circuit includes a second PWM control input, and the control loop includes a fourth operational amplifier having a first integration input, a second integration input, and an integration output, the first integration input coupled to the current feedback amplifier output, the second integration input coupled to the reference voltage output, the integration output coupled to the second PWM control input, and the dynamic error estimate accounting for error in the fourth operational amplifier.

6. The controller of claim 1, wherein the dynamic error estimate accounts for loadline, number of active phases, an output voltage range, and a target load current.

7. The controller of claim 1, wherein the dynamic error estimate accounts for temperature drift of at least one amplifier of the control loop.

8. The controller of claim 7, wherein the reference voltage controller includes circuitry to:
- obtain a first proportional to absolute temperature (PTAT) voltage through a first analog-to-digital converter (ADC) channel;
- obtain a measured temperature value through a second ADC channel;
- compute a second PTAT voltage using the measured temperature value;
- compare the first PTAT voltage against the second PTAT voltage to determine a comparison result; and
- calibrate a temperature drift parameter of the dynamic error estimate responsive to the comparison result to account for temperature drift due to bandgap.

9. The controller of claim 1, wherein the dynamic error estimate accounts for aging drift of at least one component of the control loop.

* * * * *